(12) United States Patent
Lamfalusi et al.

(10) Patent No.: US 10,749,087 B2
(45) Date of Patent: Aug. 18, 2020

(54) LEADFRAME, OPTOELECTRONIC COMPONENT HAVING A LEADFRAME, AND METHOD FOR PRODUCING AN OPTOELECTRONIC COMPONENT

(71) Applicant: OSRAM OLED GmbH, Regensburg (DE)

(72) Inventors: Tamas Lamfalusi, Regensburg (DE); Markus Richter, Burglengenfeld (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 16/344,922

(22) PCT Filed: Oct. 26, 2017

(86) PCT No.: PCT/EP2017/077491
§ 371 (c)(1),
(2) Date: Apr. 25, 2019

(87) PCT Pub. No.: WO2018/086909
PCT Pub. Date: May 17, 2018

(65) Prior Publication Data
US 2019/0259928 A1    Aug. 22, 2019

(30) Foreign Application Priority Data

Nov. 10, 2016  (DE) .................. 10 2016 121 510

(51) Int. Cl.
*H01L 33/60* (2010.01)
*H01L 33/48* (2010.01)
(Continued)

(52) U.S. Cl.
CPC ............ *H01L 33/60* (2013.01); *H01L 33/486* (2013.01); *H01L 33/502* (2013.01); *H01L 33/62* (2013.01);
(Continued)

(58) Field of Classification Search
CPC ...... H01L 33/60; H01L 33/486; H01L 33/502; H01L 33/62; H01L 33/647;
(Continued)

(56) References Cited

U.S. PATENT DOCUMENTS

| 9,954,150 B2 | 4/2018 | Schwarz et al. |
| 2010/0207135 A1* | 8/2010 | Aketa ................. H01L 25/0753 257/93 |

(Continued)

FOREIGN PATENT DOCUMENTS

| DE | 102011101052 A1 | 11/2012 |
| DE | 102012102847 A1 | 10/2013 |

*Primary Examiner* — Karen Kusumakar
(74) *Attorney, Agent, or Firm* — Slater Matsil, LLP

(57) ABSTRACT

An optoelectronic component having a leadframe and a method for producing an optoelectronic component are disclosed. In an embodiment, an optoelectronic component includes a radiation-emitting semiconductor chip having a mounting surface and side surfaces, a leadframe comprising a first element having a first main extension plane, a second element having a second main extension plane, and a third element having a third main extension plane, wherein the main extension planes are arranged parallel to one another, and wherein the elements are arranged one above the other in a stacking direction; and a reflective casting compound forming a planar surface facing the mounting surface of the semiconductor chip, wherein the semiconductor chip is mounted with the mounting surface on a support surface of the third element, which is smaller than the mounting surface of the semiconductor chip, such that the semiconductor chip projects laterally beyond the support surface of the third element.

14 Claims, 5 Drawing Sheets

(51) Int. Cl.
  *H01L 33/50*  (2010.01)
  *H01L 33/62*  (2010.01)
  *H01L 33/64*  (2010.01)
  *H01L 33/56*  (2010.01)
(52) U.S. Cl.
  CPC ............ *H01L 33/647* (2013.01); *H01L 33/56* (2013.01); *H01L 33/642* (2013.01); *H01L 2224/48091* (2013.01); *H01L 2224/48247* (2013.01); *H01L 2933/0041* (2013.01); *H01L 2933/0058* (2013.01); *H01L 2933/0066* (2013.01); *H01L 2933/0075* (2013.01)
(58) Field of Classification Search
  CPC ......... H01L 2224/48247; H01L 33/642; H01L 2224/48091; H01L 33/56; H01L 2933/0041; H01L 2933/0058; H01L 2933/0066; H01L 2933/0075
  See application file for complete search history.

(56) References Cited

U.S. PATENT DOCUMENTS

| | | | |
|---|---|---|---|
| 2013/0009190 A1* | 1/2013 | Memida | H01L 33/486 257/98 |
| 2013/0161681 A1 | 6/2013 | Lin et al. | |
| 2013/0334549 A1 | 12/2013 | Yamashita | |
| 2013/0343067 A1 | 12/2013 | Okada | |
| 2014/0346533 A1* | 11/2014 | Andrews | H01L 25/0753 257/88 |
| 2015/0155251 A1 | 6/2015 | Kawakita et al. | |
| 2015/0171282 A1 | 6/2015 | Wakaki et al. | |

* cited by examiner

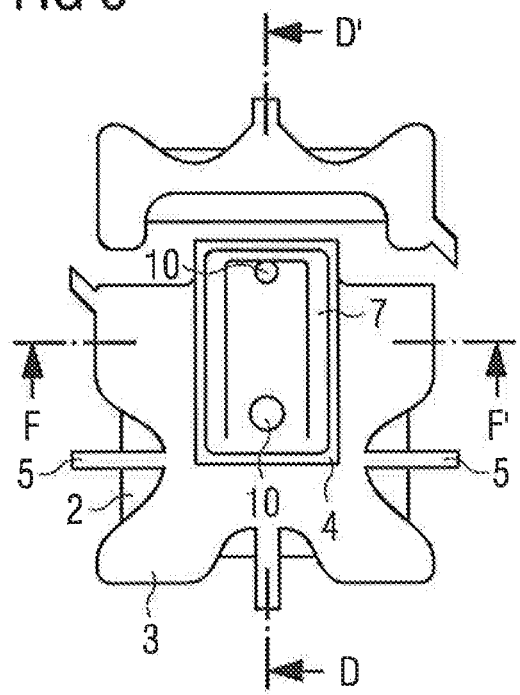
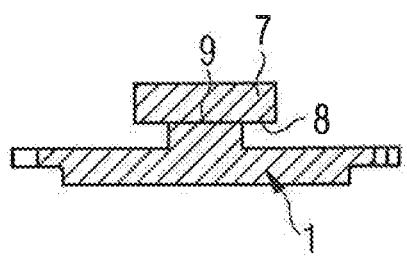
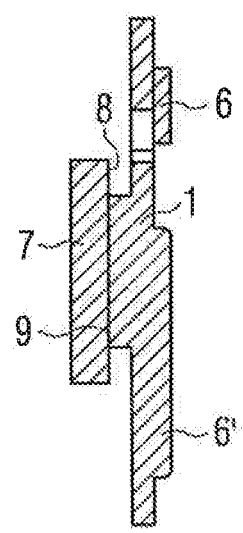

US 10,749,087 B2

LEADFRAME, OPTOELECTRONIC COMPONENT HAVING A LEADFRAME, AND METHOD FOR PRODUCING AN OPTOELECTRONIC COMPONENT

This patent application is a national phase filing under section 371 of PCT/EP2017/077491, filed Oct. 26, 2017, which claims the priority of German patent application 102016121510.4, filed Nov. 10, 2016, each of which is incorporated herein by reference in its entirety.

TECHNICAL FIELD

A leadframe, an optoelectronic component with a leadframe and a method for producing an optoelectronic component are provided.

SUMMARY OF THE INVENTION

Embodiments provide a leadframe for a radiation-emitting semiconductor chip, which enables an improved assembly of the semiconductor chip, in particular by means of adhesive bonding. Further embodiments provide an optoelectronic component with improved light extraction. Yet other embodiments provide a method for the production of an optoelectronic component with improved light.

According to an embodiment, the leadframe comprises a first element with a first main extension plane, a second element with a second main extension plane, and a third element with a third main extension plane.

The leadframe is particularly preferably formed from the first element, the second element and the third element. The three elements are preferably formed in one piece. In other words, the three elements of the leadframe preferably have no interfaces with each other. In particular, the leadframe is preferably not composed of three separately produced elements. Rather, the leadframe is preferably produced in one piece.

According to a further embodiment of the leadframe, the second element is disposed between the first element and the third element, the third element facing a front face of the leadframe and the first element facing a rear face of the leadframe.

The first main extension plane, the second main extension plane and the third main extension plane are preferably arranged parallel to one another. Furthermore, the three elements are preferably arranged one above the other in a stacking direction. The stacking direction is particularly preferably perpendicular to the three main extension planes.

According to a further embodiment of the leadframe, the third element has a support surface for a radiation-emitting semiconductor chip, which is smaller than a mounting surface of the semiconductor chip. The third element is preferably formed as a pedestal. The pedestal preferably projects beyond the leadframe, while in each case a planar surface of the second element, which is set back relative to the pedestal, is arranged laterally of the pedestal.

For example, the pedestal has the shape of a cuboid with four side surfaces, wherein the support surface is formed by a freely accessible surface of the cuboid, which is parallel to the main extension plane of the first element. The side surfaces are preferably arranged perpendicular to the support surface. The support surface is particularly preferably has a rectangular shape. However, the pedestal can also be in the form of a truncated pyramid or a truncated cone. The pedestal particularly preferably has a thickness of between 5 micrometers and 150 micrometers inclusive.

Particularly preferably, the leadframe has only a single pedestal with a support surface, which is intended for mounting the radiation-emitting semiconductor chip. In other words, the leadframe preferably has only a single support surface that is intended for mounting the semiconductor chip.

According to a further embodiment of the leadframe, the first element has electrical connection points for electrical contacting the leadframe with a connection carrier. Particularly preferably, the electrical connection points on the first element are solderable. For example, the electrical connection points are solder pads.

According to a further embodiment of the leadframe, the second element has at least one electrical contact point on a surface facing the first element for electrical contacting the semiconductor chip. This electrical contact point is preferably bondable. In other words, the electrical contact point on the second element is suitable for being electrically conductively connected to a bonding wire. The electrical contact point on the second element is therefore preferably a bond pad.

According to a further embodiment of the leadframe, the second element projects laterally beyond the first element and the third element. The second element is preferably suitable for connecting a plurality of leadframes to one another in a composite. For example, the second element has structural elements, such as bars, which project laterally out of the second element beyond the first element and the second element, and which are intended to connect a plurality of leadframes to one another to form a composite.

Particularly preferably, the leadframe is formed from an electrically conductive material, such as metal, for example. It is also possible that the leadframe has a core formed from a different material than a coating of the lead frame. The core and the coating of the leadframe are preferably formed from metals.

The leadframe is particularly suitable for being used in an optoelectronic component. The optoelectronic component comprises, in addition to the leadframe, particularly preferably a radiation-emitting semiconductor chip.

The leadframe is preferably produced separately from the semiconductor chip, for example, by punching from a sheet metal. In addition, the leadframe is preferably formed self-supporting and mechanically stable. In other words, the leadframe is not formed from layers or elements deposited on the semiconductor chip or formed on the semiconductor chip during the fabrication of the optoelectronic component. Particularly preferably, the support surface of the leadframe is freely accessible from the outside in a state being not installed.

The radiation-emitting semiconductor chip has an epitaxially grown semiconductor layer sequence comprising an active zone, which emits electromagnetic radiation when the semiconductor chip is in operation. The electromagnetic radiation is emitted from a radiation exit surface of the semiconductor chip. Here, the radiation exit surface is opposite to the mounting surface of the semiconductor chip.

For example, the epitaxial semiconductor layer sequence is based on a nitride compound semiconductor material or consists of a nitride compound semiconductor material. Nitride compound semiconductor materials are compound semiconductor materials containing nitrogen, such as the materials from the $In_xAl_yGa_{1-x-y}N$ system with $0 \leq x \leq 1$, $0 \leq y \leq 1$ and $x+y \leq 1$. Epitaxial semiconductor layers based on a nitride compound semiconductor material are generally suitable for generating blue light.

Furthermore, it is also possible that the epitaxial semiconductor layer sequence is based on a phosphide compound semiconductor material or consists of a phosphide compound semiconductor material. Phosphide compound semiconductor materials are compound semiconductor materials containing phosphorus, such as the materials from the $In_xAl_yGa_{1-x-y}P$ system with $0≤x—1$, $0≤y≤1$ and $x+y≤1$. Epitaxial semiconductor layers based on a phosphide compound semiconductor material are generally suitable for producing blue-green light.

Finally, it is also possible that the epitaxial semiconductor layer sequence is based on an arsenide compound semiconductor material or consists of an arsenide compound semiconductor material. Arsenide compound semiconductor materials are compound semiconductor materials containing arsenic, such as the materials from the $In_xAl_yGa_{1-x-y}As$ system with $0≤x≤1$, $0'y≤1$ and $x+y≤1$. Epitaxial semiconductor layers based on an arsenide compound semiconductor material are generally suitable for generating light in the red to infrared spectral range.

The radiation-emitting semiconductor chip is preferably a so-called "volume emitter". A volume-emitting semiconductor chip has a growth substrate, on which the semiconductor layer sequence has grown epitaxially. For example, if the epitaxial semiconductor layer sequence is based on a nitride compound semiconductor material, the growth substrate may contain or consist of one of the following materials: sapphire, silicon carbide. These materials are usually transparent to the light generated in the active zone. Volume-emitting semiconductor chips usually emit the radiation generated in the active zone not only via the radiation exit surface, but also via its side surfaces. If the volume emitting semiconductor chip has an electrically insulating growth substrate, the semiconductor chip usually has two front face electrical contacts.

Furthermore, the semiconductor chip can be a thin-film semiconductor chip. Thin film semiconductor chips have an epitaxially grown semiconductor layer sequence, which is deposited on a carrier, which is different from the growth substrate for the semiconductor layer sequence. Particularly preferably, a mirror layer is arranged between the epitaxial semiconductor layer sequence and the carrier, which directs radiation of the active zone to the radiation exit surface. Thin-film semiconductor chips generally do not emit the electromagnetic radiation generated during operation in the active zone via the side surfaces of the carrier, but have an essentially Lambertian radiation emission characteristic. A thin-film semiconductor chip has the advantage that the carrier material can be chosen comparatively freely. If the carrier material is formed electrically conductive, the thin-film semiconductor chip usually has a single electrical contact at the front face, while the further electrical contact is provided via the mounting surface of the semiconductor chip.

The semiconductor chip is preferably mounted with the mounting surface on the support surface of the third element of the leadframe. The support surface of the third element is preferably smaller than the mounting surface of the semiconductor chip, so that the semiconductor chip projects laterally beyond the support surface of the third element. In this way, the creep of an adhesive from the support surface of the third element to the side surfaces of the semiconductor chip or to its radiation exit surface can be advantageously avoided. In particular, if the semiconductor chip is a volume-emitting semiconductor chip that emits radiation via its side surfaces, the radiation extraction from the semiconductor chip is increased advantageously.

In this case, the semiconductor chip preferably has a mounting surface, which is larger by at least 1 micrometer than the support surface of the third element, preferably circumferentially.

Particularly preferably, the semiconductor chip is arranged centered on the support surface of the third element.

According to an embodiment of the optoelectronic component, the leadframe comprises only a single third element, which projects beyond the leadframe. Preferably, the leadframe in this embodiment has only a single semiconductor chip arranged on the support surface of the third element. The only third element of the leadframe is preferably formed as a pedestal. Particularly preferably, the leadframe does not comprise other pedestals in this embodiment.

According to a further embodiment of the optoelectronic component, the leadframe comprises a plurality of third elements, each of which is intended to carry exactly one semiconductor chip. In other words, the leadframe includes the same number of third elements as the component includes semiconductor chips. In this embodiment, each semiconductor chip is preferably mounted on the support surface of a third element.

In particular, the third element of the leadframe is preferably not a contact point for a semiconductor chip being formed as a Flip-Chip semiconductor chip. Semiconductor chips being formed as Flip-Chip semiconductor chips comprise all electrical contacts, via which they are also mounted, on their rear face.

Particularly preferably, the semiconductor chip with its mounting surface is adhered to the support surface of the third element of the leadframe and the side surfaces of the semiconductor chip are free of adhesive. This is particularly advantageous since the support surface of the third element, which is intended for mounting the semiconductor chip, is smaller than the mounting surface of the semiconductor chip. For example, a transparent silicone with a low refractive index can be used as an adhesive.

According to a particularly preferred embodiment of the optoelectronic component, the leadframe is embedded in a reflective casting compound. The reflective casting compound coats the leadframe particularly preferably in such a way that the support surface of the third element and a rear face of the leadframe are not covered by the reflective casting compound. Hollow spaces in the leadframe, for example, between the three elements, are preferably filled by the reflective casting compound, in particular completely.

The reflective casting compound, for example, is formed by a resin in which reflective particles are embedded. The resin is, for example, a silicone or an epoxy or a mixture of these two materials. The reflecting particles, for example, are titanium dioxide particles. For example, the reflective casting compound is formed by a silicone resin in which titanium dioxide particles are incorporated. Here, for example, the titanium dioxide particles in the silicone resin have a filling level of between 30% by weight and 95% by weight inclusive.

The reflective casting compound is particularly preferably formed to be diffusely reflective. Advantageously, the reflective casting compound prevents the absorption of electromagnetic radiation by the leadframe and the degeneration of the leadframe by incident light ("leadframe browning effect"). This increases the long-term stability of the component.

Particularly preferably, the reflective casting compound is arranged in such a way that it does not touch the semiconductor chip. This avoids a creep of the casting compound material on the side surfaces of the semiconductor chip or on the radiation passage surface.

According to a further embodiment of the optoelectronic component, the reflective casting compound forms a planar surface facing the mounting surface of the semiconductor chip. The surface of the reflecting casting compound is preferably arranged parallel to the first main extension plane, the second main extension plane and/or the third main extension plane. Particularly preferably, the planar surface is formed over the entire surface below and laterally of the semiconductor chip.

According to a particularly preferred embodiment of the optoelectronic component, a gap is formed between the mounting surface of the semiconductor chip and the planar surface of the reflective casting compound. In this way, a creep of the reflective casting compound material on the side surfaces of the semiconductor chip during the production of the component is advantageously avoided.

The gap between the casting compound and the mounting surface of the semiconductor chip preferably has a thickness of at least 1 micrometer. An upper limit of the thickness of the gap results preferably from the thickness of the pedestal minus one micrometer. For example, the gap has a thickness between 1 micron and 145 microns inclusive.

Particularly preferably, the planar surface of the reflective casting compound is arranged below and laterally of the semiconductor chip. This arrangement of the planar surface of the reflective casting compound has the advantage of directing electromagnetic radiation from the semiconductor chip, which is emitted in the direction of the reflective casting compound, to a radiation-emitting front face of the optoelectronic component.

According to a further embodiment, the optoelectronic component also comprises a cavity, in which the semiconductor chip is arranged. The cavity is preferably used as a reflector.

According to a further embodiment, the optoelectronic component has a further casting compound, which is formed transparent or wavelength-converting. The further casting compound preferably coats the semiconductor chip. Particularly preferably, the further casting compound coats the semiconductor chip completely. The further casting compound can be a silicone or an epoxy or a mixture of these two materials. If the further casting compound is wavelength-converting, it preferably comprises fluorescent particles converting electromagnetic radiation of the semiconductor chip into electromagnetic radiation of a different wavelength range. If the component comprises a cavity, the cavity can be filled with the further casting compound.

Particularly preferably, the further casting compound has a common interface with the reflective casting compound. Advantageously, the reflective casting compound has a very good adhesion to the further casting compound, in this case.

An optoelectronic component, for example, can be produced by providing a leadframe described here in a first step. An adhesive, for example, in the form of a drop, is then applied to the support surface of the third element of the leadframe and the semiconductor chip with its mounting surface is applied on the support surface of the leadframe with the adhesive. Finally, the semiconductor chip is pressed against the leadframe to form a thin adhesive layer between the mounting surface of the semiconductor chip and the support surface of the leadframe. After curing of the adhesive layer, the adhesive layer fixes the semiconductor chip to the support surface of the leadframe.

Particularly preferably, the adhesive layer is formed comparatively thin. A comparatively thin adhesive layer has the advantage of ensuring a good heat connection between the semiconductor chip and the leadframe. For example, the adhesive layer has a thickness being at most 5 micrometers. Particularly preferably, the thickness of the adhesive layer is between 0.1 micrometers and 2 micrometers inclusive.

The pressing of a semiconductor chip with a chip size of approximately 500 micrometers by 900 micrometers takes place, for example, with a pressing force between 70 g and 250 g inclusive.

According to an embodiment of the method, the leadframe is coated with a reflective casting compound material by casting, jetting, dispensing or a comparable method in such a way that, after curing, a reflective casting compound is formed with a planar surface below and laterally of the semiconductor chip. Particularly preferably, a gap between the mounting surface of the semiconductor chip and the planar surface of the reflective casting compound is formed, in this case.

The features described here in connection with the leadframe can also be applied to the optoelectronic component as well as to the method. Likewise, features that are only described in connection with the optoelectronic component may be applied to the leadframe and to the method. In addition, features and developments, which are described here only in connection with the method, can also be applied to the optoelectronic component and to the leadframe.

Embodiments of the present application are based on the idea of using a leadframe with a support surface for the semiconductor chip, where the support surface is smaller than the mounting surface of the semiconductor chip. This prevents an adhesive area around the semiconductor chip and a creep of the adhesive on the side surfaces of the semiconductor chip or its radiation exit surface. In particular, when using a volume-emitting semiconductor chip that emits radiation via its side surfaces, a reduction in the radiation extraction from the semiconductor due to an adhesive layer having a low refractive index chip can be avoided. In addition, the exposure of the leadframe to electromagnetic radiation from the semiconductor chip, which can lead to degeneration of the leadframe material, is advantageously reduced. This increases the life time of the optoelectronic component. In addition, the semiconductor chip is nevertheless connected to the leadframe in a thermally conductive manner via the support surface. This leads to good a heat management of the component.

BRIEF DESCRIPTION OF THE DRAWINGS

Further advantageous embodiments and developments of the invention result from the exemplary embodiments described in the following in connection with the Figures.

A leadframe according to an exemplary embodiment is explained in more detail with reference to the schematic representations of FIGS. 1 to 4.

A method for producing an optoelectronic component according to an exemplary embodiment is explained in more detail with reference to the schematic representations of FIGS. 1 to 14.

A finished optoelectronic component according to an exemplary embodiment is explained in more detail with reference to the schematic representations of FIGS. 12 to 14.

Figure 1:
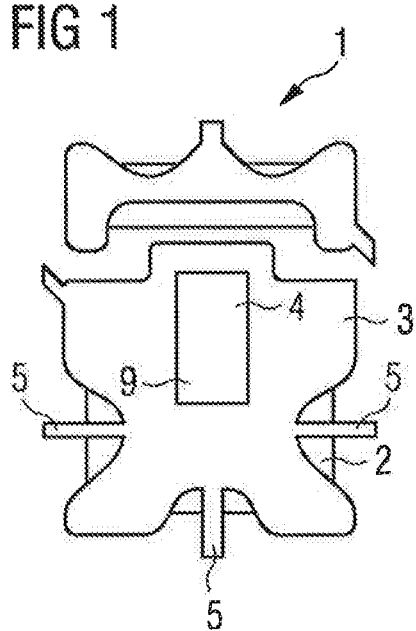
FIG. 1 shows a schematic top view of a front face of the leadframe.
Figure 11:
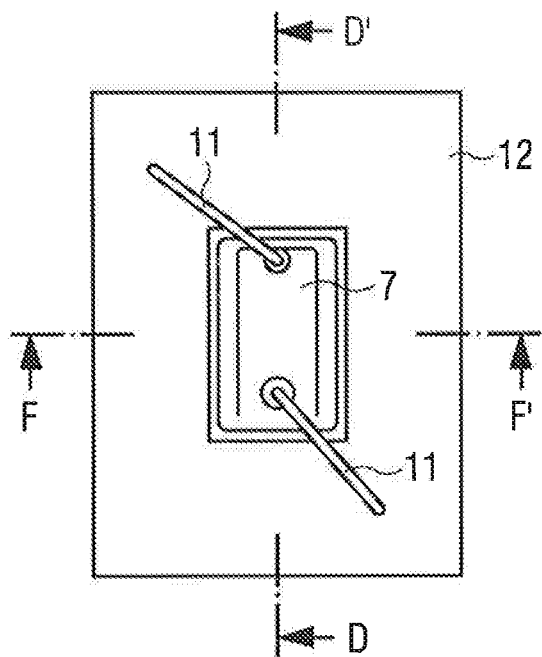
Figure 12:
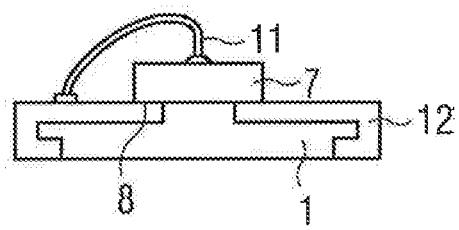
Figure 13:
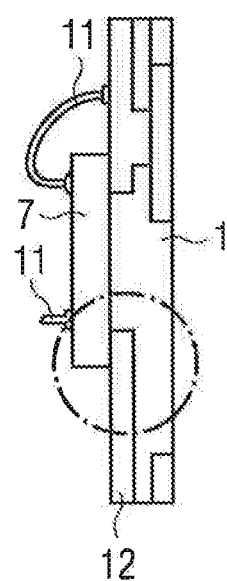

FIG. 11 shows a schematic top view of the optoelectronic component;

FIG. 12 shows a schematic sectional view along the line F-F' of FIG. 1;

FIG. 13 shows a schematic sectional view along the line D-D' of FIG. 11; and

Figure 14:
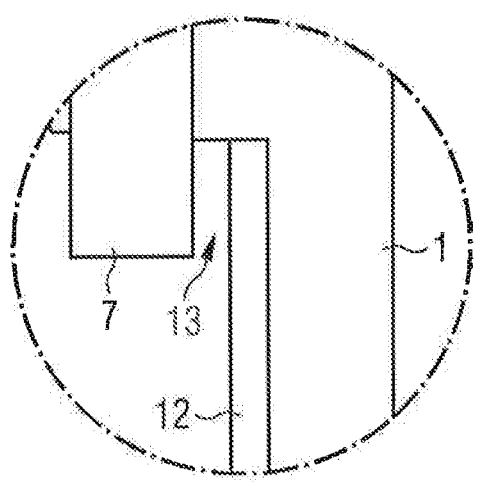

FIG. 14 schematically shows the section from FIG. 13

Figure 15:
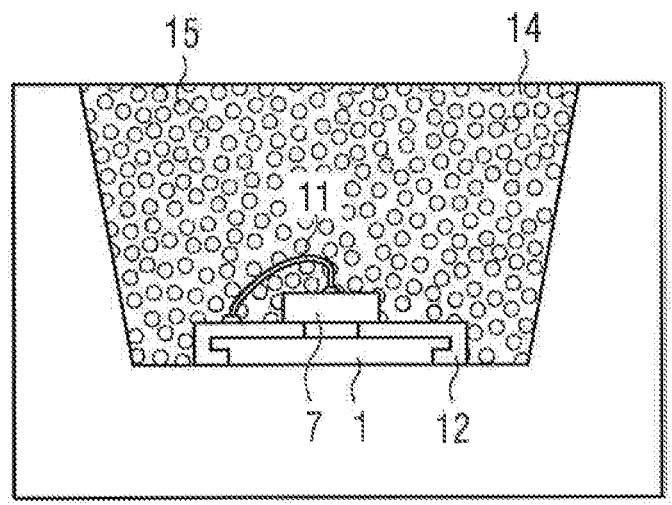

FIG. 15 shows a schematic cross-section of an optoelectronic component according to a further exemplary embodiment.

Same, similar or similar acting elements are provided with the same reference signs in the Figures. The Figures and the proportions of the elements depicted in the Figures are not to be regarded as true to scale. Rather, individual elements, in particular layer thicknesses, may be exaggeratedly large for better representability and/or better understanding.

DETAILED DESCRIPTION OF ILLUSTRATIVE EMBODIMENTS

The leadframe 1 according to the exemplary embodiment of FIGS. 1 to 4 has a first element 2, a second element 3 and a third element 4. The first element 2 forms a rear side of the leadframe 1, while the third element 4 forms the front face of the leadframe 1. The second element 3 is arranged between the first element 2 and the third element 4.

The second element 3 of the leadframe 1 is formed by two separate structural elements, which are spatially separated from one another (FIG. 1). The two structural elements can each be provided with an electrical contact point, which is suitable for being electrically conductively connected to a bonding wire. Furthermore, it is also possible that the second element 3 itself is bondable.

The first structural element of the second element 3 is butterfly-shaped with four bulges. Between two bulges, the first structural element has bars 5, which are suitable for connecting a plurality of leadframes 1 to one another to form a composite. The second structural element of the second element 3 has two bulges and is overall considerably narrower than the first structural element.

Figure 2:
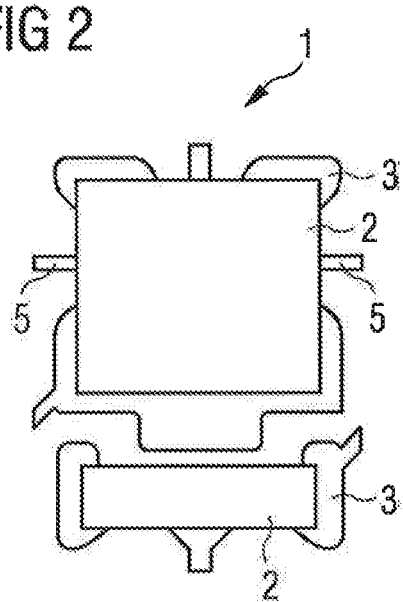
FIG. 2 shows a schematic top view of a rear face of the leadframe.

The first element 2 of the leadframe 1 is also formed by two separate, spatially separated structural elements, both of which are formed rectangular (FIG. 2). The two structural elements, which are separated from one another, can be formed as rear face electrical connection points 6, 6' for electrical contacting with a connection carrier. Preferably the electrical connection points 6, 6' are solderable. Parts of the second element 3 project laterally beyond the structural elements of the first element 2.

The third element 4 of the leadframe 1 is arranged on the second element 3 and has a rectangular shape. The third element 4 is formed as a cuboid pedestal. The second element 3 projects laterally completely along the border of the third element 4 beyond the third element. The third element 4 is formed as a pedestal which projects beyond the leadframe 1 (FIG. 3).

Figure 3:
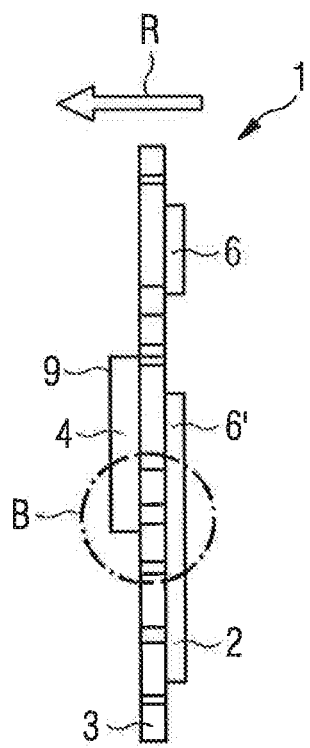
FIG. 3 shows a schematic sectional view of the leadframe.
Figure 4:
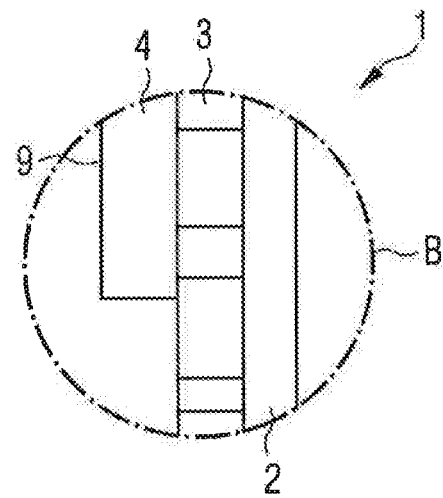
FIG. 4 shows a detail of section B of FIG. 3.

The first element 2, the second element 3 and the third element 4 of the leadframe 1 each have a main extension plane arranged parallel to one another (FIGS. 3 and 4). In addition, the first element 2, the second element 3 and the third element 4 are arranged in direct contact with one another along a stacking direction R. The stacking direction R is perpendicular to the main extension planes of the three elements 2, 3, 4. The third element 4 is connected to the second element 3 over the entire surface.

In the method for producing an optoelectronic component according to FIGS. 1 to 14, a leadframe is first provided, as described in detail with reference to FIGS. 1 to 4.

As shown schematically in FIGS. 5 to 7, a radiation-emitting semiconductor chip 7 with a mounting surface 8 is now applied to a support surface 9 of the third element 4. FIG. 6 shows a schematic sectional view along the cutting line F-F' of the schematic top view of FIG. 5, while FIG. 7 shows a schematic sectional view along the line D-D' of FIG. 5.

The mounting surface 8 of the semiconductor chip 7 is larger than the support surface 9 of the third element 4 (FIGS. 6 and 7). The mounting surface 8 projects laterally beyond the support surface 9 of the third element 4 along the complete circumference of the support surface 9. The semiconductor chip 7 is arranged centered on the support surface 9.

In the present case, a volume-emitting semiconductor chip with a radiation-transmissive growth substrate and two front face electrical contacts 10 is used as the semiconductor chip 7, as schematically shown in FIG. 5. The semiconductor chip 7 therefore emits light not only via its radiation exit surface, which is opposite the mounting surface, but also at least partially via its side surfaces.

Figure 8:
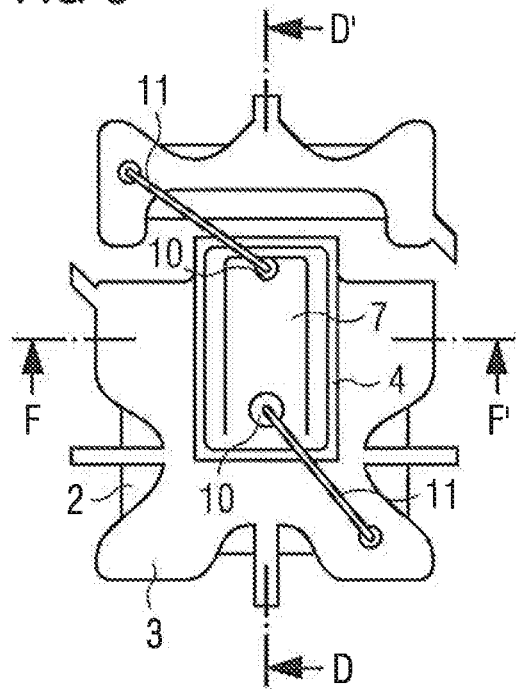
Figure 9:
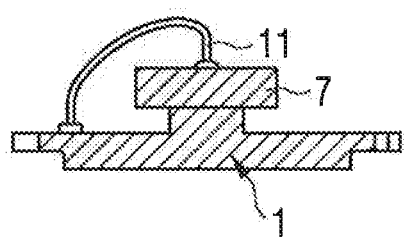
Figure 10:
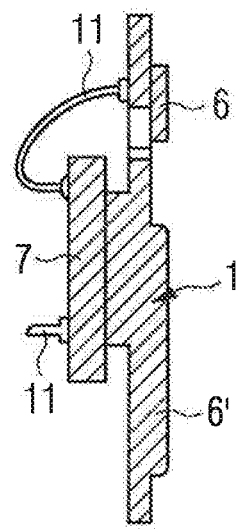

In a next step, schematically shown in FIGS. 8 to 10, the front face electrical contacts 10 of the optoelectronic semiconductor chip 7 are each electrically conductively connected with a bonding wire 11 to an electrical contact point on the second element 3 of the leadframe 1. Each structural element of the second element has a contact point.

FIG. 9 shows a schematic section along the line F-F' of the schematic top view of FIG. 8, while FIG. 10 shows a schematic section along the line D-D' of FIG. 8.

In a next step, which is schematically shown in FIGS. 11 to 14, the leadframe 1 is coated with a reflective casting compound material, for example, by casting, jetting, dispensing or a comparable method. The reflective casting compound is made of a silicone, in which titanium dioxide particles with a filling degree of between 30% and 95% by weight are incorporated. After application of the casting compound, it is cured so that a reflective 12 casting compound is created.

As shown, for example, in the schematic plan view of FIG. 11, the reflective casting compound 12 completely coats the leadframe 1 laterally. Furthermore, the reflective casting compound 12 forms a planar surface, which faces the mounting surface 8 of the semiconductor chip 7 and is parallel to it (FIGS. 12 and 13). A part of the bonding wire 11 is coated by the reflective casting compound 12. Furthermore, a gap 13 is formed between the planar surface of the reflective casting compound 12 and the mounting surface 8 of the semiconductor chip 7, as shown schematically in FIG. 14.

In contrast to the optoelectronic component shown in FIGS. 11 to 14, the optoelectronic component shown in the exemplary embodiment in FIG. 15 has a cavity, in which the semiconductor chip 7 is arranged on the leadframe 1. Furthermore, the component comprises a wavelength-converting casting compound 15, which is arranged in the cavity 14 and has a common interface with the reflecting casting compound 12.

The invention is not limited by the description on the basis of the exemplary embodiments. Rather, the invention includes each new feature as well as the combination of features, which includes in particular for each combination of features in the claims, even if this feature or combination itself is not explicitly specified in the claims or the exemplary embodiments.

The invention claimed is:

1. An optoelectronic component comprising:
   a radiation-emitting semiconductor chip having a mounting surface and side surfaces;
   a leadframe comprising:
      a first element having a first main extension plane;
      a second element having a second main extension plane, and
      a third element having a third main extension plane,
         wherein the first main extension plane, the second main extension plane and the third main extension plane are arranged parallel to one another, and
         wherein the first element, the second element and the third element are arranged one above the other in a stacking direction; and
   a reflective casting compound forming a planar surface facing the mounting surface of the semiconductor chip,
   wherein the semiconductor chip is mounted with the mounting surface on a support surface of the third element, which is smaller than the mounting surface of the semiconductor chip, such that the semiconductor chip projects laterally beyond the support surface of the third element,
   wherein the semiconductor chip is adhered with the mounting surface to the support surface,
   wherein the side surfaces of the semiconductor chip are free of an adhesive,
   wherein the leadframe is embedded in the reflective casting compound, and
   wherein a gap is formed between the mounting surface of the semiconductor chip and the planar surface of the reflective casting compound.

2. The optoelectronic component according to claim 1, wherein the mounting surface is at least 1 micrometer larger than the support surface of the third element.

3. The optoelectronic component according to claim 1, wherein the semiconductor chip is arranged centered on the support surface of the third element.

4. The optoelectronic component according to claim 1, wherein the semiconductor chip is configured to emit electromagnetic radiation during operation via a radiation exit surface and the side surfaces.

5. The optoelectronic component according to claim 1, wherein the gap has a thickness between 1 micrometer and 145 micrometers inclusive.

6. The optoelectronic component according to claim 1, wherein the planar surface of the reflective casting compound is arranged below and laterally of the semiconductor chip.

7. The optoelectronic component according to claim 1, wherein the third element is formed as a pedestal and has a thickness between $_5$ micrometers and 150 micrometers inclusive.

8. The optoelectronic component according to claim 1, wherein the first element has electrical connection points configured to electrically contact the leadframe with a connection carrier.

9. The optoelectronic component according to claim 1, wherein the second element has at least one electrical contact point on a main side facing the first element, the electrical contact point is configured to electrically contact the semiconductor chip.

10. The optoelectronic component according to claim 1, wherein the second element projects laterally in places beyond the first element and the third element, and wherein the second element is configured to connect a plurality of leadframes to one another in a composite.

11. A method for producing an optoelectronic component, the method comprising:
    providing the leadframe according to claim $1_9$;
    applying an adhesive to the support surface of the third element of the leadframe;
    placing the semiconductor chip on the support surface and the adhesive; and
    pressing the semiconductor chip against the support surface such that a thin adhesive layer is formed.

12. The method according to claim 11, wherein the adhesive layer has a thickness of at most 5 micrometers.

13. The method according to claim 11, wherein the leadframe is coated with a reflective casting compound material by casting, jetting or dispensing in such a way that the reflective casting compound is formed having the planar surface below and laterally of the semiconductor chip.

14. The method according to claim 13, wherein the gap is formed between the mounting surface of the semiconductor chip and the planar surface of the reflective casting compound.

* * * * *

UNITED STATES PATENT AND TRADEMARK OFFICE
CERTIFICATE OF CORRECTION

PATENT NO. : 10,749,087 B2
APPLICATION NO. : 16/344922
DATED : August 18, 2020
INVENTOR(S) : Lamfalusi et al.

Page 1 of 1

It is certified that error appears in the above-identified patent and that said Letters Patent is hereby corrected as shown below:

In the Claims

In Column 10, Line 10, Claim 7, delete "between$_5$" and insert --between 5--.

In Column 10, Line 27, Claim 11, delete "claim $1_9$" and insert --claim 1--.

Signed and Sealed this
Tenth Day of November, 2020

Andrei Iancu
*Director of the United States Patent and Trademark Office*